United States Patent
Pfirsch

(10) Patent No.: US 12,068,390 B2
(45) Date of Patent: Aug. 20, 2024

(54) POWER SEMICONDUCTOR DEVICE HAVING A GATE DIELECTRIC STACK THAT INCLUDES A FERROELECTRIC INSULATOR

(71) Applicant: Infineon Technologies AG, Neubiberg (DE)

(72) Inventor: Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 257 days.

(21) Appl. No.: 17/387,351

(22) Filed: Jul. 28, 2021

(65) Prior Publication Data
US 2023/0035173 A1 Feb. 2, 2023

(51) Int. Cl.
*H01L 29/51* (2006.01)
*H01L 29/40* (2006.01)
(Continued)

(52) U.S. Cl.
CPC .......... *H01L 29/516* (2013.01); *H01L 29/407* (2013.01); *H01L 29/513* (2013.01);
(Continued)

(58) Field of Classification Search
CPC ... H01L 29/516; H01L 29/407; H01L 29/513; H01L 29/7397; H01L 29/7813; H01L 29/78391; H01L 29/0623; H01L 29/1608; H01L 29/66348; H01L 29/1095; H01L 21/28158–28238; H01L 29/51–518; H01L 29/66833–6684; H10B 51/00–50
See application file for complete search history.

(56) References Cited

U.S. PATENT DOCUMENTS 6,335,550 B1   1/2002 Miyoshi et al.
6,887,799 B1   5/2005 Li et al.
(Continued)

FOREIGN PATENT DOCUMENTS

CN   206003774 U   3/2017
DE   102009038710 A1   4/2011

OTHER PUBLICATIONS

Hoffmann, Michael, et al., "Ferroelectric phase transitions in nanoscale HfO2 films enable giant pyroelectric energy conversion and highly efficient supercapacitors", Nano Energy, ISSN: 2211-2855, vol. 18, Nov. 2015, 154-164.
(Continued)

*Primary Examiner* — Shahed Ahmed
(74) *Attorney, Agent, or Firm* — Murphy, Bilak & Homiller, PLLC

(57) ABSTRACT

A power semiconductor device includes a semiconductor substrate and a plurality of transistor cells formed in the semiconductor substrate and electrically connected in parallel to form a power transistor. Each transistor cell includes a gate structure including a gate electrode and a gate dielectric stack separating the gate electrode from the semiconductor substrate. The gate dielectric stack includes a ferroelectric insulator and a first dielectric insulator. The first dielectric insulator has a relative permittivity greater than that of silicon dioxide. A driver device for switching the power transistor and a corresponding method of operating the power transistor are also described.

12 Claims, 11 Drawing Sheets

(51) Int. Cl.
    *H01L 29/739*     (2006.01)
    *H01L 29/78*     (2006.01)

(52) U.S. Cl.
    CPC ...... *H01L 29/7397* (2013.01); *H01L 29/7813* (2013.01); *H01L 29/78391* (2014.09)

(56) References Cited

U.S. PATENT DOCUMENTS

| | | |
|---|---|---|
| 8,809,971 B2 | 8/2014 | Schulze et al. |
| 9,871,136 B2 | 1/2018 | Chen et al. |
| 9,978,868 B2 | 5/2018 | Lai et al. |
| 2003/0235064 A1 | 12/2003 | Batra et al. |
| 2004/0051126 A1 | 3/2004 | Cuchiaro et al. |
| 2005/0035401 A1 | 2/2005 | Yamaguchi et al. |
| 2005/0282329 A1 | 12/2005 | Li |
| 2006/0073653 A1 | 4/2006 | Jang et al. |
| 2006/0146102 A1 | 7/2006 | Kim et al. |
| 2007/0075351 A1 | 4/2007 | Schulz et al. |
| 2007/0111448 A1 | 5/2007 | Li et al. |
| 2008/0105978 A1 | 5/2008 | Schmitt et al. |
| 2008/0116523 A1 | 5/2008 | Li |
| 2008/0251816 A1 | 10/2008 | Tanaka et al. |
| 2010/0044853 A1 | 2/2010 | Dekker et al. |
| 2010/0129968 A1 | 5/2010 | Li et al. |
| 2010/0237432 A1 | 9/2010 | Takeoka et al. |
| 2010/0285662 A1 | 11/2010 | Kim et al. |
| 2010/0308400 A1 | 12/2010 | Darwish et al. |
| 2011/0049593 A1 | 3/2011 | Schulze et al. |
| 2011/0170330 A1 | 7/2011 | Oezyilmaz et al. |
| 2011/0241123 A1 | 10/2011 | Li |
| 2012/0248522 A1 | 10/2012 | Goyal et al. |
| 2012/0292677 A1 | 11/2012 | Dubourdieu et al. |
| 2013/0037823 A1 | 2/2013 | Kanemura et al. |
| 2013/0099253 A1 | 4/2013 | Ohtsuka et al. |
| 2013/0248950 A1 | 9/2013 | Kang et al. |
| 2014/0117464 A1 | 5/2014 | Chang et al. |
| 2015/0364566 A1 | 12/2015 | Liu et al. |
| 2015/0380511 A1* | 12/2015 | Irsigler ............ H01L 29/78391 257/295 |
| 2017/0141235 A1 | 5/2017 | Lai et al. |
| 2017/0358684 A1 | 12/2017 | Chen et al. |
| 2018/0083141 A1 | 3/2018 | Chen et al. |
| 2018/0182860 A1 | 6/2018 | Lee et al. |
| 2018/0240804 A1 | 8/2018 | Yoo |
| 2019/0067488 A1 | 2/2019 | Tsai et al. |
| 2019/0148510 A1 | 5/2019 | Chien et al. |
| 2019/0207009 A1 | 7/2019 | Yamaguchi |
| 2020/0098926 A1* | 3/2020 | Sharma ............ H01L 29/78391 |
| 2020/0105898 A1 | 4/2020 | Hsu et al. |
| 2020/0357927 A1 | 11/2020 | Hsieh et al. |
| 2021/0119003 A1* | 4/2021 | Van Treek ............ H01L 29/407 |
| 2021/0175340 A1 | 6/2021 | Ramaswamy et al. |
| 2023/0238444 A1* | 7/2023 | Gosavi .................. H01L 29/516 257/295 |

OTHER PUBLICATIONS

Lomenzo, Patrick D., et al., "Universal Curie constant and pyroelectricity in doped ferroelectric HfO2 thin films", Nano Energy, ISSN: 2211-2855, vol. 74, Issue: 104733, Apr. 18, 2020, 1-10.

Mikolajick, Thomas, et al., "Ferroelectric hafnium oxide for ferroelectric random-access memories and ferroelectric field effect transistors", MRS Bulletin. vol. 43., May 2018, pp. 340-346.

* cited by examiner

POWER SEMICONDUCTOR DEVICE HAVING A GATE DIELECTRIC STACK THAT INCLUDES A FERROELECTRIC INSULATOR

BACKGROUND

Power transistors such as power MOSFETs (metal-oxide-semiconductor field-effect transistors), IGBTs (insulated gate bipolar transistors), etc. are well-suited for high power, high voltage, high temperature and radiation resistance applications. A key limiting factor for power transistor development is accommodating the power device in switching applications at short circuit conditions. Power transistor are sensitive to excessive voltage and temperature which leads to over-heating. Over a longer period, overheating seriously affects device reliability and performance, finally resulting in hard destruction of the device. Techniques have been devised to prevent continuous operation of power transistor during short circuit conditions, including efficient ways to dissipate heat and smart gate drive designs that turn-off the device at high operating temperatures.

Heat dissipation mechanisms typically involve passive measures via a heat sink, thereby avoiding over-heating. Furthermore, temperature sensors may be embedded in a power transistor die (chip) to detect operating temperature used for preventing high-temperature operation. Integrated current sensors occupy a significant amount of die area, requiring a higher power density for the active transistor cells of the device.

SiC (silicon carbide) power MOSFETs have 5 to 10 times higher current density under short circuit conditions compared to IGBTs (insulated-gate bipolar transistors). Higher instantaneous power density and smaller thermal capacitance results in faster temperature rise and lower short circuit withstand time, placing immense pressure on the design of gate drivers that need to have very fast response times—much smaller than needed for IGBTs. Die protection can be ensured only by the gate drive to detect the overcurrent condition and turn-off the MOSFET within the withstand time off (e.g., about 3 ms), which poses a tough design challenge.

Thus, there is a need for a power transistor device with improved short-circuit/overcurrent protection.

SUMMARY

According to an embodiment of a power semiconductor device, the power semiconductor device comprises: a semiconductor substrate; and a plurality of transistor cells formed in the semiconductor substrate and electrically connected in parallel to form a power transistor, wherein each transistor cell of the plurality of transistor cells comprises a gate structure including a gate electrode and a gate dielectric stack separating the gate electrode from the semiconductor substrate, wherein the gate dielectric stack comprises a ferroelectric insulator and a first dielectric insulator, wherein the first dielectric insulator has a relative permittivity greater than that of silicon dioxide.

According to an embodiment of a method of operating a power transistor formed by a plurality of transistor cells electrically connected in parallel, wherein each transistor cell of the plurality of transistor cells comprises a gate structure including a gate electrode coupled to a control terminal and a gate dielectric stack, wherein the gate dielectric stack comprises a ferroelectric insulator, the method comprises: switching the power transistor in a normal operating mode by applying a switching control signal to the control terminal, the switching control signal having a maximum voltage and a minimum voltage; and setting the ferroelectric insulator into a defined polarization state by applying a first voltage pulse to the control terminal, the first voltage pulse exceeding the maximum voltage of the switching control signal.

According to an embodiment of a driver device, the driver device comprises: a power semiconductor device comprising a plurality of transistor cells electrically connected in parallel to form a power transistor, wherein each transistor cell of the plurality of transistor cells comprises a gate structure including a gate electrode coupled to a control terminal and a gate dielectric stack, wherein the gate dielectric stack comprises a ferroelectric insulator; and a driver control circuit configured to switch the power transistor in a normal operating mode by applying a switching control signal to the control terminal, the switching control signal having a maximum voltage and a minimum voltage, wherein the driver control circuit is further configured to set the ferroelectric insulator into a defined polarization state by applying a first voltage pulse to the control terminal, the first voltage pulse exceeding the maximum voltage of the switching control signal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
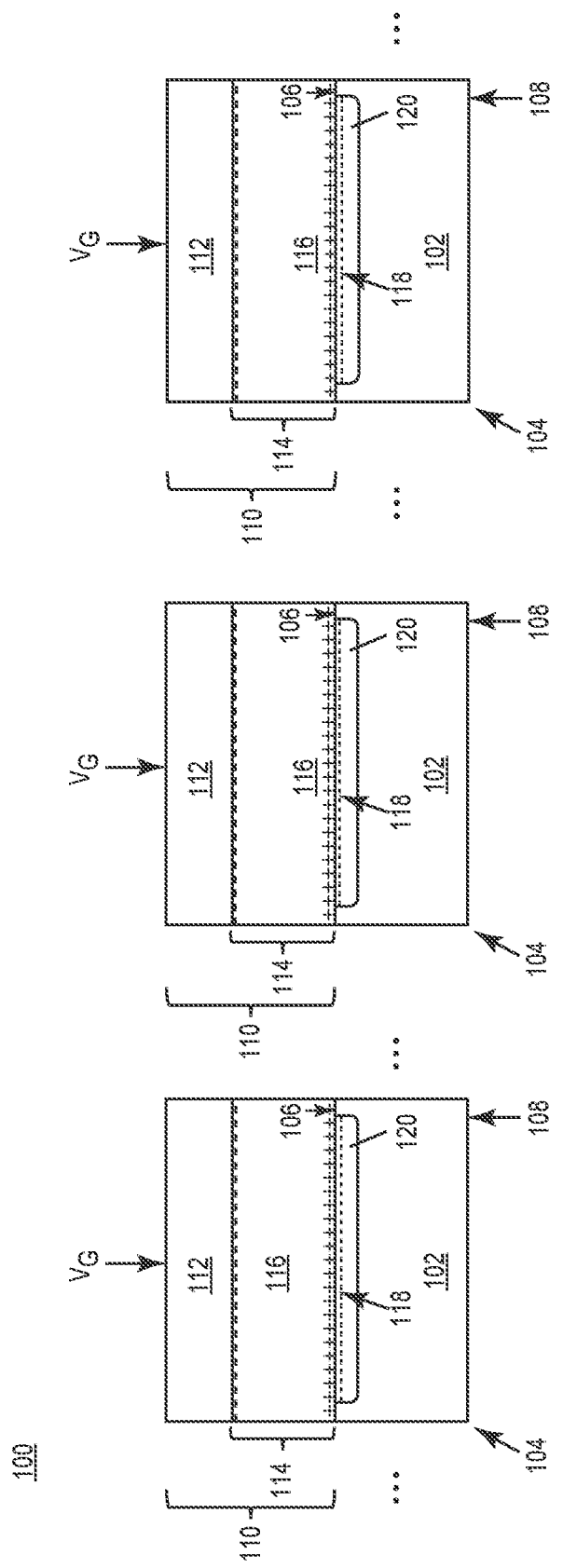
FIG. 1 illustrates a partial lateral cross-sectional view of an embodiment of a semiconductor device that includes a ferroelectric-based gate dielectric stack.

Described herein is a gate dielectric stack that provides improved short-circuit/overcurrent protection for semiconductor devices. The type of semiconductor device that includes the gate dielectric stack may depend on the application of interest and may include power semiconductor devices which are semiconductor devices used as switches or rectifiers in power electronic circuits. Regardless of the type of semiconductor device, a plurality of transistor cells formed in a semiconductor substrate utilize the gate dielectric stack and are electrically connected in parallel to form a transistor.

The gate dielectric stack includes a ferroelectric insulator as a key enabler towards improved short-circuit/overcurrent protection. This insulator is 'ferroelectric' in that the insulator has a spontaneous electric polarization that can be reversed by the application of an external electric field, unlike non-ferroelectric insulators such as $SiO_2$ and SiN which do not have such a reversible spontaneous electric polarization.

The ferroelectric insulator included in the gate dielectric stack exhibits spontaneous electrical polarization. This polarization is retained until a characteristic temperature, called the Curie temperature (Tc) or Curie point. The Curie temperature is the temperature above which the ferroelectric insulator loses its ferroelectric properties and electrical polarization. Accordingly, the ferroelectric polarization of the ferroelectric insulator adds to the dielectrically induced charge to create a conductive channel below the Curie temperature. Above the Curie temperature, the ferroelectric insulator is no longer polarized so that the total induced charge in the channel region decreases and a higher gate voltage is required to create the channel at all, or at unchanged gate voltage, the channel conductivity is greatly reduced, thus helping to limit overcurrent conditions. By integrating the ferroelectric insulator into the gate dielectric stack of the device, the device becomes temperature sensitive such that the device self-regulates the drain current beyond the maximum safe operating temperature of the device.

The ferroelectric insulator may be doped with a doping material such that the Curie temperature of the ferroelectric insulator is in a range above the specified operating temperature range of the device where the specified operating temperature range defines the minimum and maximum operating temperatures for the device. For short periods of time, the device temperature may exceed the maximum operating temperature, e.g., due to a short-circuit condition. Above this temperature, the ferroelectric insulator of the gate dielectric stack loses its polarization which in turn causes the threshold voltage of the device to increase. Accordingly, a higher gate voltage is required to create the conductive channel outside the specified operating temperature range than what is required within the specified operating temperature range.

The polarization of the ferroelectric insulator follows a well-defined hysteresis curve as a function of gate voltage. However, the polarization state of the ferroelectric insulator may not be in a well-defined after an overtemperature event subsides or during start-up of the power transistor. The ferroelectric insulator may be placed in a defined polarization state by applying a voltage pulse to the control terminal of the power transistor that exceeds the maximum (permitted) voltage of the switching control signal used to control the switching state (on/off) of the power transistor during normal operation. Setting the ferroelectric insulator into a defined polarization state may further include applying a second voltage pulse to the control terminal, the second voltage pulse having an opposite polarity as the first voltage pulse and exceeding a minimum (permitted) voltage of the switching control signal.

For example, in the case of an n-channel device, the maximum voltage of the switching control signal is a positive maximum voltage, the first voltage pulse is more positive than the positive maximum voltage of the switching control signal, the minimum voltage of the switching control signal is a negative minimum voltage, and the second voltage pulse is more negative than the negative minimum voltage of the switching control signal. In the case of a p-channel device, the maximum voltage of the switching control signal is a negative maximum voltage, the first voltage pulse is more negative than the negative maximum voltage of the switching control signal, the minimum voltage of the switching control signal is a positive minimum voltage, and the second voltage pulse is more positive than the positive minimum voltage of the switching control signal. Hence, as used herein, 'exceeding' means to go beyond or surpass in terms of absolute magnitude, i.e., to be more positive in the case of a positive voltage or to be more negative in the case of a negative voltage. The minimum voltages may be smaller in absolute value than the respective maximum voltages, and may even be zero. By preconditioning the ferroelectric insulator of the gate dielectric stack as described herein, the ferroelectric insulator is placed in a defined polarization state that is suitable for normal operation.

The ferroelectric-based gate dielectric stack may be used in any type of semiconductor device that includes a plurality of transistor cells formed in a semiconductor substrate and electrically connected in parallel to form a transistor. For example, the semiconductor substrate may be a SiC substrate, a Si substrate, a GaN substrate, etc. The transistor may be a vertical transistor or a lateral transistor. For example, the transistor may be a power MOSFET, IGBT, MOS-controlled thyristor, HEMT (high-electron mobility transistor), etc.

As explained above, the ferroelectric insulator of the gate dielectric stack may include a doping material that sets the Curie temperature of the ferroelectric insulator in a range above the specified operating temperature range of the transistor device. The dopant material may be one or more dopants such as Al, Si, Gd, Yr, La, Sr, and/or Zr, an alloy, etc. depending on the type of ferroelectric insulator used.

The ferroelectric insulator may comprise hafnium oxide ($HfO_2$), for example. However, other ferroelectric insulating materials may be used such as but not limited to aluminum nitride with scandium doping. In the case of hafnium oxide, the doping material used to realize ferroelectricity in $HfO_2$ in the desired temperature range may be different dopants such as Al, Si, Gd, Yr, La, Sr, and/or Zr. The dopant concentration may be adjusted depending upon the application, to tune the Curie temperature.

The gate dielectric stack may include just the ferroelectric insulator and no other dielectric layers. The gate dielectric stack may instead include one or more non-ferroelectric insulating layers in addition to the ferroelectric insulator. For example, the gate dielectric stack may include both the ferroelectric insulator and a first dielectric insulator having a relative permittivity greater than that of silicon dioxide. The first dielectric insulator may contact the semiconductor substrate.

The gate dielectric stack may further include a second dielectric insulator and the ferroelectric insulator may be interposed between the first and second dielectric insulators. The second dielectric insulator may contact the semiconductor substrate and separate the ferroelectric insulator from the semiconductor substrate, and the ferroelectric insulator may separate the second dielectric insulator from the first dielectric insulator. The ferroelectric insulator may comprise a material selected from the group consisting of doped hafnium oxide and doped hafnium zirconium oxide, the first dielectric insulator may comprise a material selected from the group consisting of undoped hafnium oxide, undoped hafnium zirconium oxide, yttrium oxide, and aluminum oxide, and the second dielectric insulator may comprise a material selected from the group consisting of undoped hafnium oxide, undoped hafnium zirconium oxide, yttrium oxide, and aluminum oxide.

At room temperature, the polarization of the ferroelectric insulator acts like a positive gate charge thereby reducing the threshold voltage of the device. The amount of threshold voltage reduction depends on the doping of the ferroelectric insulator and on the thickness ratio of the ferroelectric insulator to any non-ferroelectric insulator included in the gate dielectric stack. The body region doping of the device may be increased and/or the thickness of the gate dielectric stack may be increased to achieve approximately the same room-temperature threshold voltage as a conventional MOSFET having a $SiO_2$ gate oxide but without any ferroelectric material. Such an approach ensures widely unchanged electrical device properties below the Curie temperature.

As the device begins to reach a short circuit condition, a rapid rise in temperature occurs. Once the temperature exceeds the Curie temperature, the ferroelectric insulator in the gate dielectric stack almost instantaneously (in the nanosecond range) undergoes a phase transition. Accordingly, polarization in the ferroelectric insulator is lost which leads to an almost immediate increase in the threshold voltage of the device. This increase in threshold voltage reduces the overdrive voltage (gate-to-source voltage minus threshold voltage), which ultimately reduces the drain current. With lower drain current, lower heat generation is ensured.

The reduction in drain current owing to the phase transition in the ferroelectric-based gate dielectric stack of the device allows the gate drive to act towards safely turning off the device over a critical time-period, significantly improving short circuit reliability. The ferroelectric-based gate dielectric stack decouples or eliminates the strict trade-off between a low $R_{ON}XA$ (area-specific on-resistance) at normal operation temperatures and limited non-destructive peak currents in the case of a short-circuit event.

After the operating temperature drops to within the safe operating range, the ferroelectric insulator may be placed in a defined polarization state by applying a voltage pulse to the control terminal of the power transistor that exceeds the maximum (permitted) voltage of the switching control signal used to control the switching state (on/off) of the power transistor during normal operation. Accordingly, the ferroelectric insulator regains its ferroelectric polarization and the threshold voltage is restored to the same voltage as before the short circuit event. The same process may be used for placing the ferroelectric insulator in a defined polarization state during startup, before the power transistor enters the normal operating mode.

Described next, with reference to the figures, are exemplary embodiments of the ferroelectric-based gate dielectric stack of the power transistor, a driver device for switching the power transistor, and a corresponding method of operating the power transistor which includes setting the ferroelectric insulator of the gate dielectric stack into a defined polarization state. Some of the figures are explained in the context of a particular semiconductor material system and/or device type for ease of explanation and/or illustration. However, as explained above, the ferroelectric-based gate dielectric stack may be used in any type of semiconductor device that includes a plurality of transistor cells formed in a semiconductor substrate and electrically connected in parallel to form a power transistor.

FIG. 1 illustrates a partial cross-sectional view of an embodiment of a semiconductor device 100 that includes a semiconductor substrate 102. The semiconductor substrate 102 may comprise any type of semiconductor material such as SiC, Si, GaN, etc. The semiconductor substrate 102 may include a base semiconductor and one or more epitaxial layers grown on the base semiconductor.

The partial cross-sectional view of FIG. 1 is in the gate region of three (3) neighboring transistor cells 104 formed in the semiconductor substrate 102. The device 100 may include 10s, 100s, 1000s or even more of the transistor cells 104 as indicated by the dashed horizontal lines in FIG. 1. The transistor cells 104 are electrically connected in parallel to form a power transistor. For example, the transistor cells 104 may share a source or emitter connection, a drain or collector connection, and a gate connection. The resulting power transistor may be a vertical transistor in that the primary current flow direction is between the front and back surfaces 106, 108 of the semiconductor substrate 102. The power transistor instead may be a lateral transistor in that the primary current flow direction is along the front surface 106 of the semiconductor substrate 102.

In either case, each transistor cell 104 includes a gate structure 110 including a gate electrode 112 and a gate dielectric stack 114 separating the gate electrode 112 from the semiconductor substrate 102. FIG. 1 shows the semiconductor device 100 implemented as a planar gate device in that the gate structure 110 is formed on the front surface 106 of the semiconductor substrate 102. However, the semiconductor device 100 instead may be implemented as a trench gate device in that the gate structure 110 may be disposed in a trench formed in the front surface 106 of the semiconductor substrate 102.

In either case, the gate dielectric stack 114 includes a ferroelectric insulator 116. The gate dielectric stack 114 may include just the ferroelectric insulator 116 and no other insulating layers. The ferroelectric insulator 116 may comprise a single layer. The ferroelectric insulator 116 instead may comprise two or more layers having different doping levels. Separately or in combination, the ferroelectric insulator 116 may comprise two or more different ferroelectric materials. For example, the ferroelectric insulator 116 may comprise doped hafnium oxide ($HfO_2$) and/or doped hafnium zirconium oxide. The doping material of the doped hafnium oxide and/or doped hafnium zirconium oxide may include one or more impurity species selected from the group consisting of Al, Si, Gd, Yr, La, Sr, and Zr.

In general, the power transistor formed by the parallel-connected transistor cells 104 has a specified operating temperature range over which the transistor is expected to safely operate. For example, the specified operating temperature range may be from −55° C. to 200° C., −55° C. to 175° C., −40° C. to 150° C., etc. The ferroelectric insulator 116 of the gate dielectric stack 114 is doped with a doping material such that the Curie temperature ($T_c$) of the ferroelectric insulator 116 is in a range above the specified operating temperature range of the transistor. In some cases, the Curie temperature of the ferroelectric insulator 116 may not be higher than 100K above the specified operating temperature range of the power transistor. For example, the Curie temperature of the ferroelectric insulator 116 may be 50K or less above the specified operating temperature range of the power transistor.

In the desired defined polarization state below the Curie temperature (Tc), a relatively fixed amount of ferroelectric polarization charges are present at the boundaries of the ferroelectric insulator 116 as indicated by the vertically offset rows of negative ('-') and positive ('+') charges in FIG. 1. In addition to these charges, there are gate voltage '$V_G$' dependent dielectric polarization charges just as in a gate stack with a standard dielectric only, which together create a conductive (inversion) channel 118 in a body region 120 of each transistor cell 104. The ferroelectric polarization charges however increase the density of charge carriers in the inversion channel 118 and thereby its conductivity. The conductive channel 118 is shown as an electron inversion layer for an n-channel device. The conductive channel 118 instead may be a hole inversion layer for a p-channel device. For a p-channel device, the gate voltage $V_G$ would polarize the ferroelectric insulator 116 in the opposite manner as shown in FIG. 1.

Above the Curie temperature Tc, the ferroelectric insulator 116 is no longer polarized and a higher gate voltage $V_G$ is required to create the channel 118, thus helping to limit overcurrent conditions. After the operating temperature Tc drops to within the safe operating temperature range of the power transistor, the ferroelectric insulator 116 may be placed in a defined polarization state by applying a voltage pulse to a control terminal of the power transistor and thus to the gate electrodes 112, the voltage pulse exceeding the maximum (permitted) voltage of the switching control signal used to control the switching state (on/off) of the power transistor in the normal operating mode. Accordingly, the ferroelectric insulator 16 regains its ferroelectric polarization and the threshold voltage is restored to the same voltage as before the short circuit event. The same process may be used for placing the ferroelectric insulator 116 in a defined polarization state during startup. The power transistor enters the normal operating mode after exiting startup. In the normal operating mode, the power transistor is switched on and off, e.g., under PWM (pulse width modulation) control, to source or sink load current.

Figure 2:
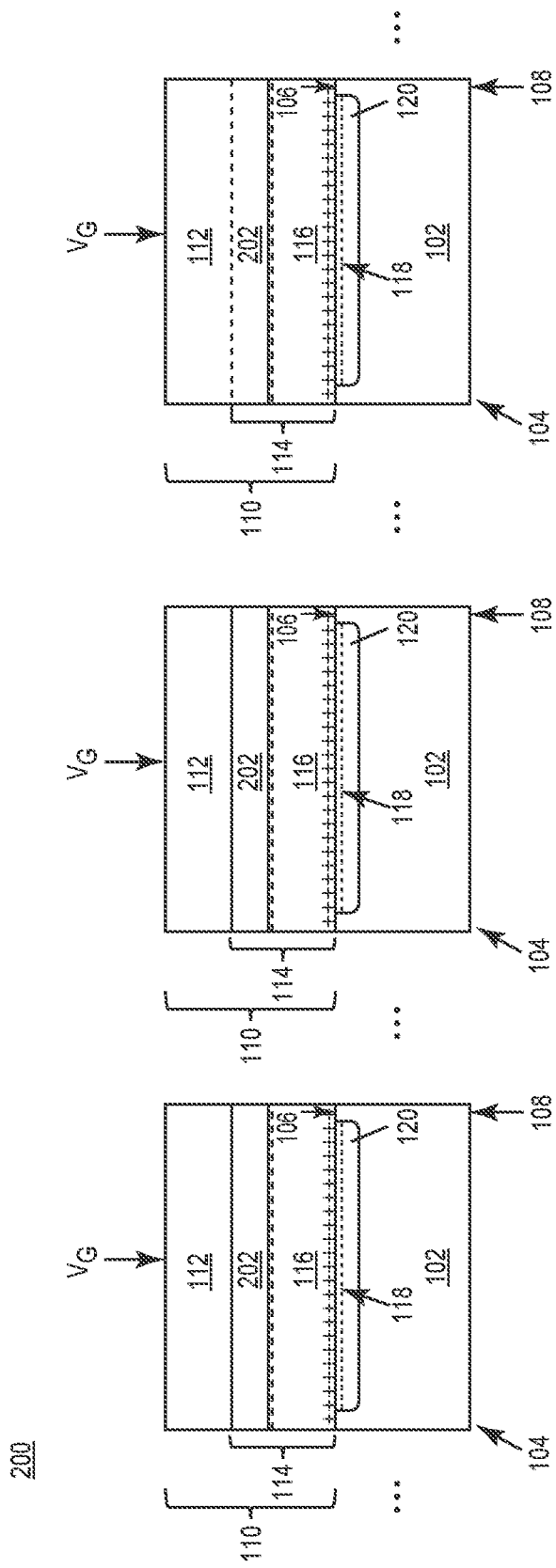
FIG. 2 illustrates a partial lateral cross-sectional view of another embodiment of a semiconductor device that includes a ferroelectric-based gate dielectric stack.

FIG. 2 illustrates a partial cross-sectional view of another embodiment of a semiconductor device 200 that includes the ferroelectric insulator 116 in the gate dielectric stack 114. The embodiment shown in FIG. 2 is similar to the embodiment shown in FIG. 1. Different, however, the gate dielectric stack 114 further includes a first dielectric insulator 202. The first dielectric insulator 202 has a relative permittivity greater than that of silicon dioxide ($SiO_2$). The ferroelectric insulator 116 may contact the semiconductor substrate 102 and separate the first dielectric insulator 202 from the semiconductor substrate 102, as shown in FIG. 2. In another embodiment (not shown), the ferroelectric insulator 116 may contact the gate electrode 112 and separate the first dielectric insulator 202 from the gate electrode 112. In one embodiment, the first dielectric insulator 202 comprises a material selected from the group consisting of undoped hafnium oxide, undoped hafnium zirconium oxide, yttrium oxide, and aluminum oxide.

Figure 3:
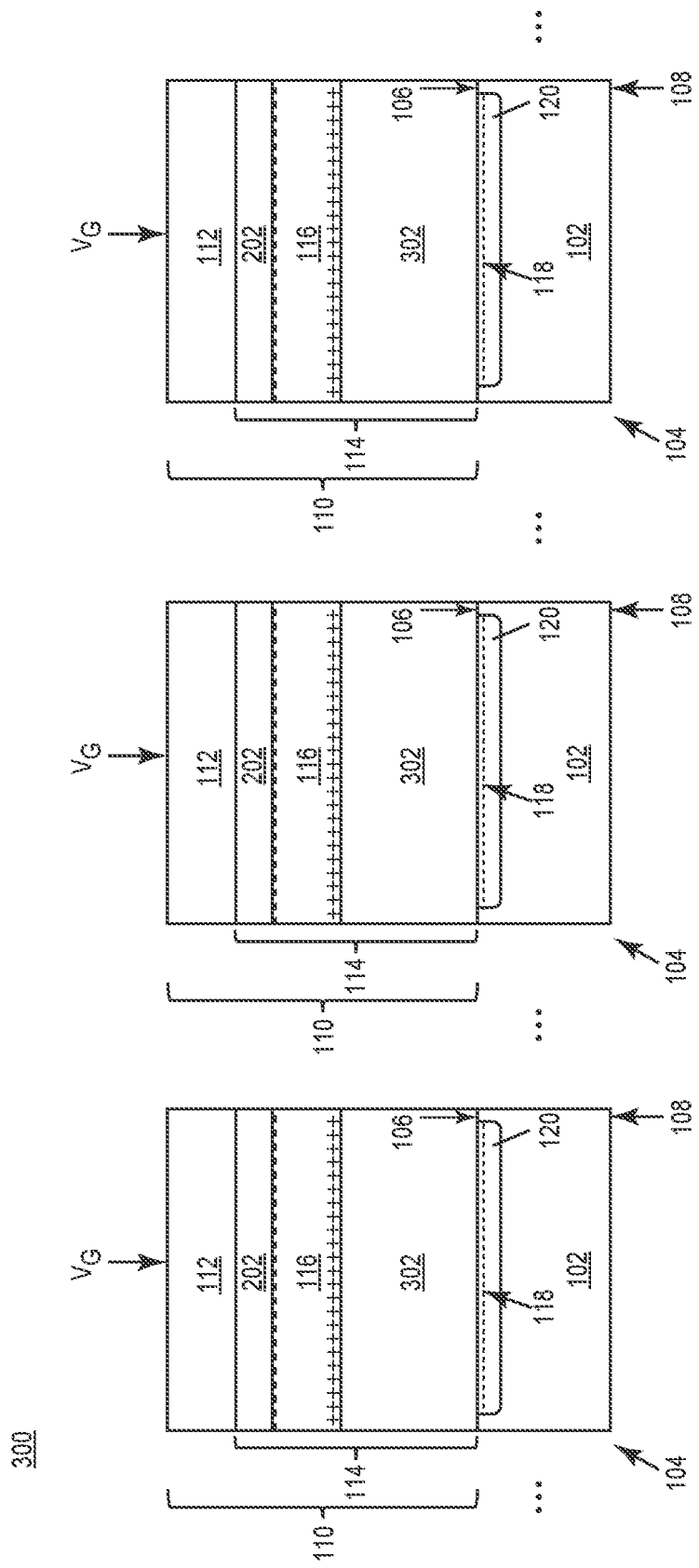
FIG. 3 illustrates a partial lateral cross-sectional view of another embodiment of a semiconductor device that includes a ferroelectric-based gate dielectric stack.

FIG. 3 illustrates a partial cross-sectional view of another embodiment of a semiconductor device 300 that includes the ferroelectric insulator 116 in the gate dielectric stack 114. The embodiment shown in FIG. 3 is similar to the embodiment shown in FIG. 2. Different, however, the gate dielectric stack 114 further includes a second dielectric insulator 302. The second dielectric insulator 302 contacts the semiconductor substrate 102 and separates the ferroelectric insulator 116 from the semiconductor substrate 102. The ferroelectric insulator 116 separates the second dielectric insulator 302 from the first dielectric insulator 202. In one embodiment, the ferroelectric insulator 116 comprises a material selected from the group consisting of doped hafnium oxide and doped hafnium zirconium oxide, the first dielectric insulator 202 comprises a material selected from the group consisting of undoped hafnium oxide, undoped hafnium zirconium oxide, yttrium oxide, and aluminum oxide, and the second dielectric insulator 302 comprises a material selected from the group consisting of undoped hafnium oxide, undoped hafnium zirconium oxide, yttrium oxide, and aluminum oxide.

Figure 4:
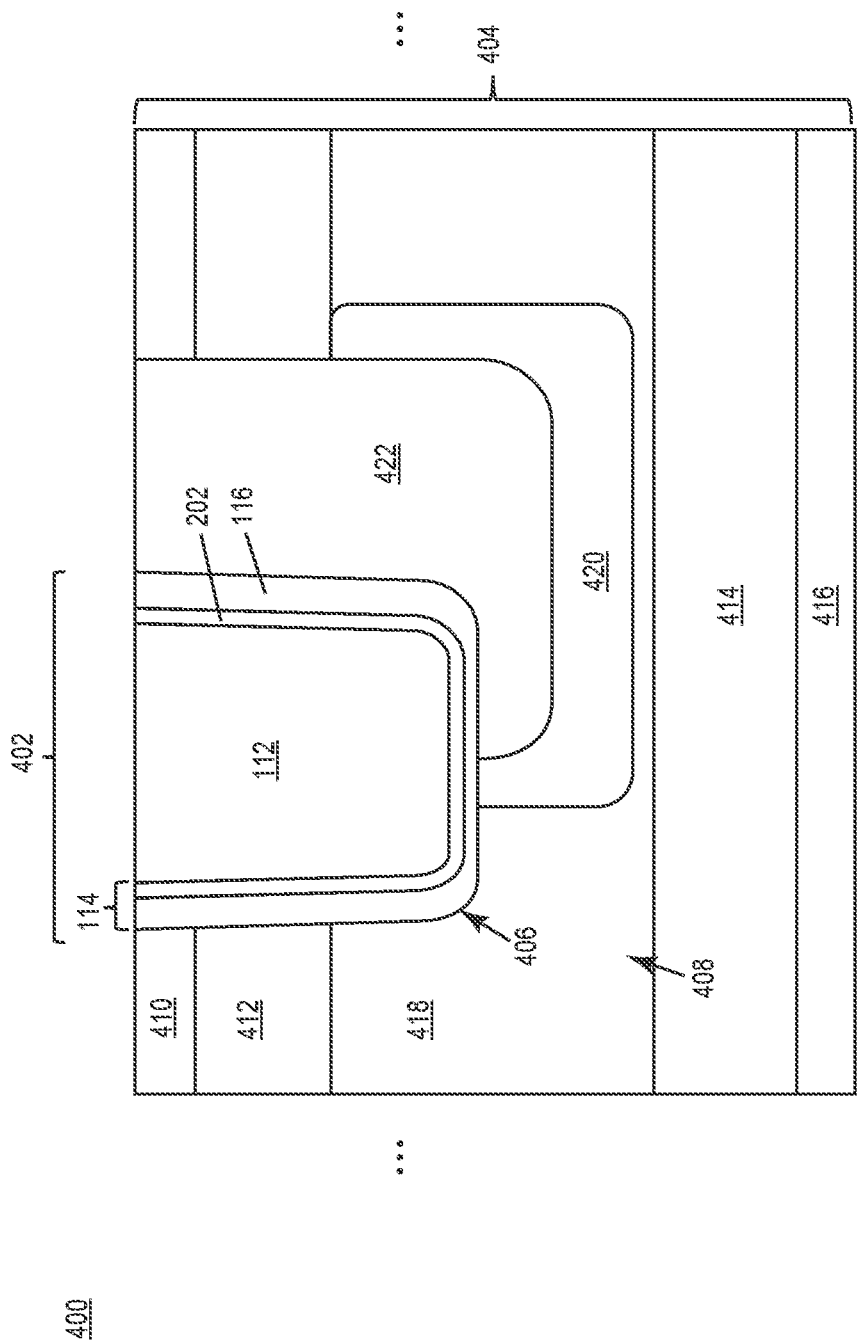
FIG. 4 illustrates a partial cross-sectional view of another embodiment of a semiconductor device that includes a ferroelectric-based gate dielectric stack.

FIG. 4 illustrates a partial cross-sectional view of another embodiment of a SiC power semiconductor device 400 that includes the ferroelectric insulator 116 in the gate dielectric stack 114. Si-based power MOSFETs can achieve 10 μs short-circuit protection whereas SiC-based devices have a more limited short-circuit response. Hence, the threshold voltage adjustment provided by the ferroelectric insulator 116 is particularly beneficial for the SiC power semiconductor device 400.

The SiC power semiconductor device 400 has a trench transistor gate structure 402 formed in a SiC substrate 404. The trench transistor gate structure 402 includes a gate trench 406 formed in the SiC substrate 404, e.g., by etching. Only one transistor cell 408 is shown in FIG. 4. However, the SiC power semiconductor device 400 may include 10s, 100s, 1000s or even more of the transistor cells 408 to form a power MOSFET, as indicated by the horizontal dashed lines in FIG. 4. Each transistor cell 408 also includes a source (S) region 410 of a first conductivity type and a body region 412 of a second conductivity type opposite the first conductivity type and disposed at the sidewalls of the gate trench 406. The body region 412 separates the source region 410 from a drift zone 414 of the first conductivity type. A drain (D) region 416 of the first conductivity type adjoins the drift zone 414 at the opposite side of the SiC substrate 404 as the source region 410.

The SiC power semiconductor device 400 may also include a current-conduction region 418 of the first conductivity type in the SiC substrate 404 below and adjoining the body region 412. For example, the current-conduction region 418 may adjoin the bottom of the gate trench 404 and may be a JFET (junction field-effect transistor) region.

The SiC power semiconductor device 400 may also include a shielding region 420 of the second conductivity type. The shielding region 420 is laterally adjacent to the current-conduction region 418 and configured to at least partly shield the bottom of the gate trench 406 from an electric field during operation of the SiC power semiconductor device 400. The gate trench 406 may have rounded corners which leads to enhanced field crowding, and the shielding region 420 limits the electric field in this region of the trench transistor gate structure. The shielding region 420 may be contacted by a contact region 422 of the second conductivity type and that has a higher doping concentration than the shielding region 420.

As previously explained herein, the gate dielectric stack 114 of the transistor cell 408 may include just the ferroelectric insulator 116 and no other insulating layers or instead may include one or more non-ferroelectric insulating layers in addition to the ferroelectric insulator 116. With this understanding, FIG. 4 shows an example of the gate dielectric stack 114 including the ferroelectric insulator 116 and a first (non-ferroelectric) dielectric insulator 202. The first dielectric insulator 202 has a relative permittivity greater than silicon dioxide ($SiO_2$). Accordingly, the ferroelectric insulator 116 may line the sidewalls and bottom of the gate trench 406 and therefore contact the SiC substrate 404, as shown in FIG. 4. However, the first dielectric insulator 202 instead may line the sidewalls and bottom of the gate trench 406 and separate the ferroelectric insulator 116 from the SiC substrate 404. For example, the first dielectric insulator 202 may be formed in contact with the SiC substrate 404 by depositing dielectric hafnium dioxide on the SiC substrate 404 before forming the ferroelectric insulator 116. The ferroelectric insulator 116 is then formed on the first dielectric insulator 202, e.g., by atomic layer deposition (ALD) in the case of ferroelectric $HfO_2$.

The ferroelectric insulator 116 may be doped in situ or ex situ to set the Curie temperature of the ferroelectric insulator 116 in a range above the specified operating temperature range of the SiC power semiconductor device 400. The doping can be realized, e.g., by depositing a layer stack that includes the ferroelectric material and the doping material with a suitable choice of the layer thicknesses and intermixing these materials by a subsequent high-temperature treatment in a range of 250° C. to 1200° C., e.g., 300° C. to 1000° C. A second (non-ferroelectric) dielectric insulator (not shown in FIG. 4) may be formed on the ferroelectric insulator 116 such that the ferroelectric insulator 116 is interposed between two (non-ferroelectric) dielectric insulators, e.g., as shown in FIG. 3.

Figure 5:
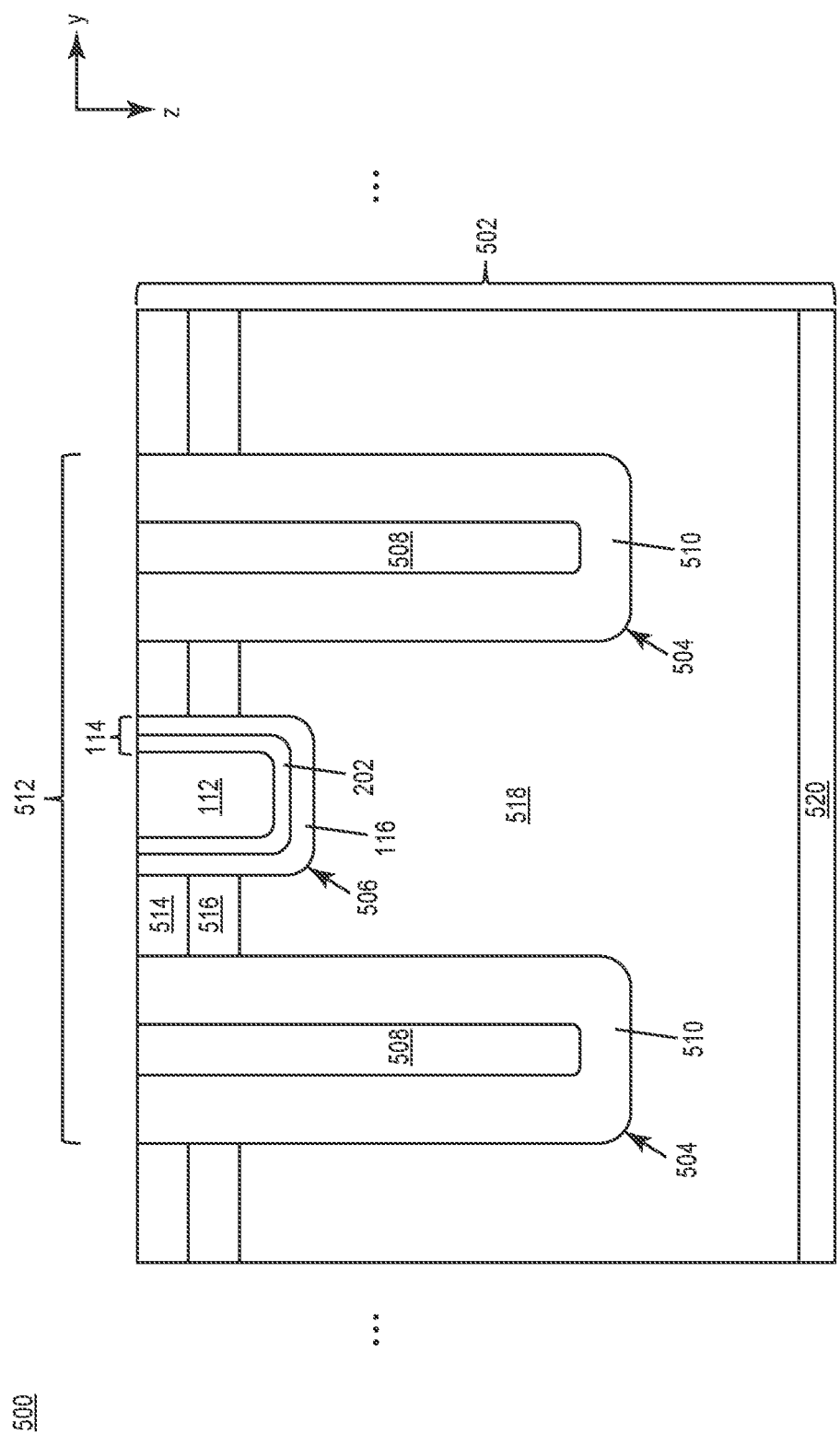
FIG. 5 illustrates a partial cross-sectional view of another embodiment of a semiconductor device that includes a ferroelectric-based gate dielectric stack.

FIG. 5 illustrates a partial cross-sectional view of another embodiment of a semiconductor device 500 that includes the gate dielectric stack 114. According to the embodiment illustrated in FIG. 5, the semiconductor device 500 is a power transistor having a field plate trench configuration.

The semiconductor device 500 includes a semiconductor substrate 502. The semiconductor substrate 502 may include one or more of a variety of semiconductor materials that are used to form semiconductor devices such as power MOSFETs, IGBTs (insulated gate bipolar transistors), HEMTs (high-electron mobility transistors), etc. For example, the semiconductor substrate 502 may include silicon (Si), silicon carbide (SiC), germanium (Ge), silicon germanium (SiGe), gallium nitride (GaN), gallium arsenide (GaAs), and the like. The semiconductor substrate 502 may be a bulk semiconductor material or may include one or more epitaxial layers grown on a bulk semiconductor material.

The semiconductor device 500 further includes field plate trenches 504 formed in the semiconductor substrate 502. The field plate trenches 504 may be needle-shape or stripe-shaped. The semiconductor device 500 also includes gate trenches 506 formed in the semiconductor substrate 502. The gate trenches 506 may be needle-shape or stripe-shaped. The field plate trenches 504 and the gate trenches 506 and interspersed with one another. The term 'needle-shaped' as used herein means a trench structure that is narrow and long in a depth-wise direction (z direction in FIG. 5) of the semiconductor substrate 502. For example, the field plate trenches 504 and/or the gate trenches 506 may resemble a needle, column or spicule in the depth-wise (z) direction of the semiconductor substrate 502. For stripe-shaped trenches, the lengthwise extension runs into and out of the page in FIG. 5.

A field plate 508 is disposed in each field plate trench 504 and separated from the surrounding semiconductor substrate 502 by a field dielectric 510. The field plate trenches 504 may extend deeper into the semiconductor substrate 502 than the gate trenches 506. The field plates 508 and the gate electrodes 112 may be made from any suitable electrically conductive material such as polysilicon, metal, metal alloy, etc. The field plates 508 and the gate electrodes 112 may comprise the same or different electrically conductive material. The field dielectric 510 and the first (non-ferroelectric) dielectric insulator 202, if provided, of the gate dielectric stack 114 may comprise the same or different electrically insulative material, e.g., $HfO_2$, $SiO_2$ and $HfO_2$, etc., and may be formed by one or more common processes such as thermal oxidation and/or deposition.

Only one transistor cell 512 is shown in FIG. 5. However, the semiconductor device 500 may include 10s, 100s, 1000s or even more of the transistor cells 512 to form a power transistor, as indicated by the horizontal dashed lines in FIG. 5. Each transistor cell 512 also includes a source region 514 of a first conductivity type and a body region 516 of a second conductivity type opposite the first conductivity type and disposed at the sidewalls of the gate trench 506. The body region 516 separates the source region 514 from a drift zone 518 of the first conductivity type. A drain region 520 of the first conductivity type adjoins the drift zone 518 at the opposite side of the semiconductor substrate 502 as the source region 514.

Figure 6:
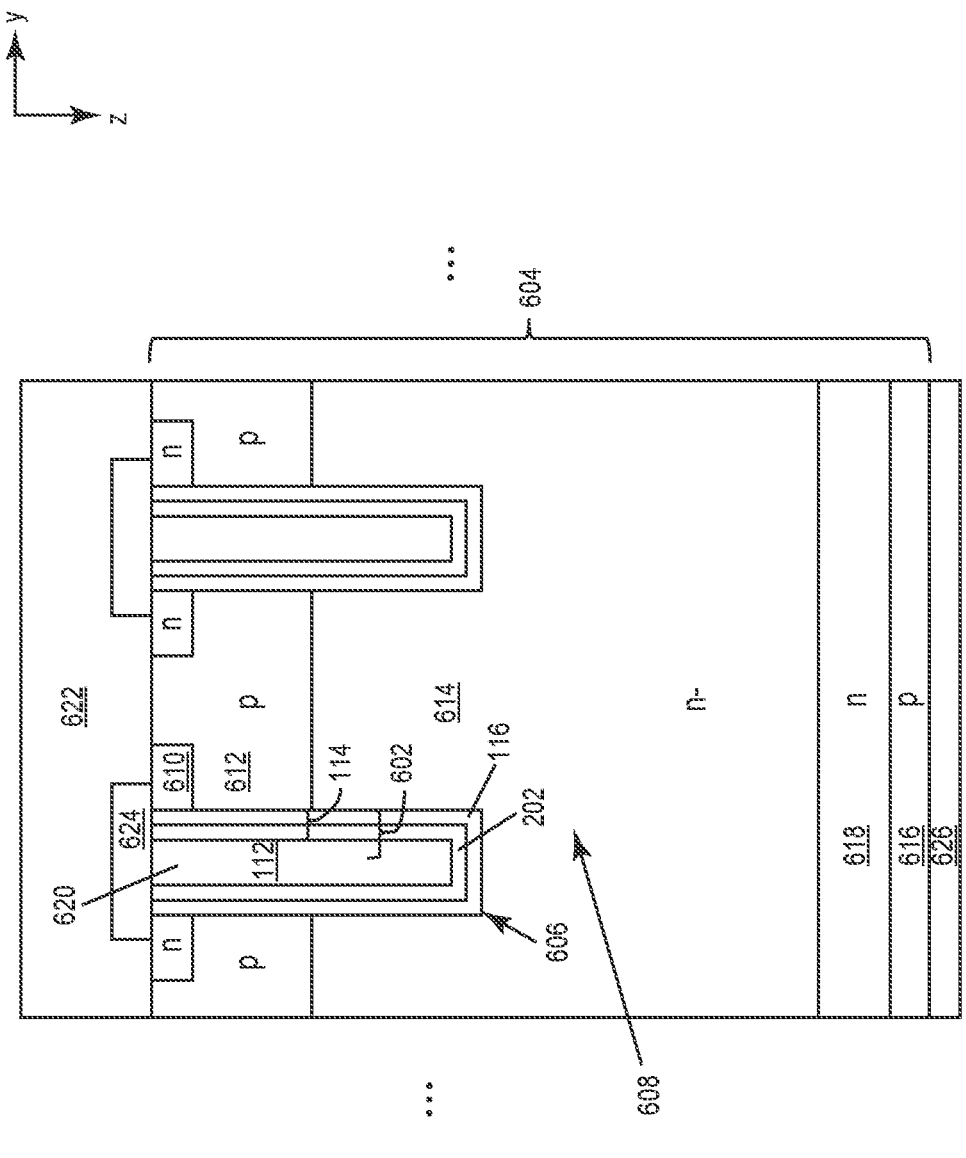
FIG. 6 illustrates a partial cross-sectional view of another embodiment of a semiconductor device that includes a ferroelectric-based gate dielectric stack.

FIG. 6 illustrates a partial cross-sectional view of an embodiment of an Insulated Gate Bipolar Transistor (IGBT) 600 that includes the ferroelectric insulator 116 in the gate dielectric stack 114. Si-based IGBTs are often required to achieve 10 μs short-circuit protection and may be designed with a lower on-state voltage if the short-circuit current could be limited in case of too high temperature. Hence, the threshold voltage adjustment provided by the ferroelectric insulator 116 is also beneficial for the IGBT device 600.

The IGBT device 600 has a trench transistor gate structure 602 formed in a semiconductor substrate 604 (e.g., Si or SiC). The trench transistor gate structure 602 includes a gate trench 606 formed in the semiconductor substrate 604, e.g., by etching. Only two transistor cells 608 are shown in FIG. 6. However, the IGBT device 600 may include 10s, 100s, 1000s or even more of the transistor cells 608 to form a power device, as indicated by the horizontal dashed lines in FIG. 6. Each transistor cell 608 also includes a source (S) region 610 of a first conductivity type (n-type in this example) and a body region 612 of a second conductivity type opposite the first conductivity type (p-type in this example) and disposed at the sidewalls of the gate trench 606. The body region 612 separates the source region 610 from a drift zone 614 of the first conductivity type. A collector (C) region 616 of the second conductivity type adjoins the drift zone 614 at the opposite side of the semiconductor substrate 604 as the source region 610. The collector region 616 may instead be coupled to the drift zone 614 via a field stop zone 618 of the first conductivity type but with a higher doping concentration than the drift zone 614.

As previously explained herein, the gate dielectric stack 114 of the transistor cell 608 may include just the ferroelectric insulator 116 and no other insulating layers or instead may include one or more non-ferroelectric insulating layers in addition to the ferroelectric insulator 116. With this understanding, FIG. 6 shows an example of the gate dielectric stack 114 including the ferroelectric insulator 116 and a first (non-ferroelectric) dielectric insulator 202. The first dielectric insulator 202 has a relative permittivity greater than silicon dioxide ($SiO_2$). Accordingly, the ferroelectric insulator 116 may line the sidewalls and bottom of the gate trench 606 and therefore contact the semiconductor substrate 604, as shown in FIG. 6. However, the first dielectric insulator 202 instead may line the sidewalls and bottom of the gate trench 606 and separate the ferroelectric insulator 116 from the semiconductor substrate 604.

The ferroelectric insulator 116 may be doped in situ or ex situ to set the Curie temperature of the ferroelectric insulator 116 in a range above the specified operating temperature range of the IGBT device 600. A second (non-ferroelectric) dielectric insulator (not shown in FIG. 6) may be formed on the ferroelectric insulator 116 such that the ferroelectric insulator 116 is interposed between two (non-ferroelectric) dielectric insulators, e.g., as shown in FIG. 3.

A gate electrode material 620 is formed in the gate trench 606. Any suitable gate electrode material 620 may be used such as polysilicon, metal, metal alloy, etc. The structure may then be planarized, e.g., using CMP (chemical-mechanical polishing) to form the final gate structure which includes the gate electrode 112 and the gate dielectric stack 114 separating the gate electrode 112 from the semiconductor substrate 604.

An emitter metallization layer 622 contacts the source region 610 and the body region 612. The emitter metallization layer 622 is separated from the gate electrode 112 by an isolating layer 624. A collector metallization layer 626 contacts the collector region 616 at the opposite side of the semiconductor substrate 604 as the emitter metallization layer 622.

For each semiconductor device described herein, polarization 'P' occurs in the ferroelectric insulator 116 below the Curie temperature Tc and loss of polarization occurs in the ferroelectric insulator 116 above the Curie temperature. Electrically, an increase in device temperature above $T_c$ leads to no significant polarization in the ferroelectric insulator 116 such that the ferroelectric insulator 116 transitions from the ferroelectric phase to a paraelectric phase. Structurally, a change from non-centrosymmetric (orthorhombic) form to centrosymmetric (paraelectric tetragonal) form brings about this change. In addition to the loss in electric polarization, dielectric permittivity increases with a rise in temperature towards $T_c$.

For device operation, this means that below $T_c$ the ferroelectric insulator 116 has a polarization charge and the gate voltage $V_G$ required to create the channel or inversion layer 118 is $V_{GE,th1}$. As the ferroelectric insulator 116 retains the polarization when operated below the Curie temperature $T_c$, the semiconductor device 100 can still be turned on by applying $V_{GE,th1}$. When the same device 100 is operated above $T_c$ or in the prolonged absence of the gate voltage $V_G$, the ferroelectric insulator 116 loses its strong polarization and becomes paraelectric. In this case, the amount of gate voltage $V_G$ needed to create the channel/inversion layer 118 is $V_{GE,th2}$ where $|V_{GE,th2}|>|V_{GE,th1}|$.

Figure 7:
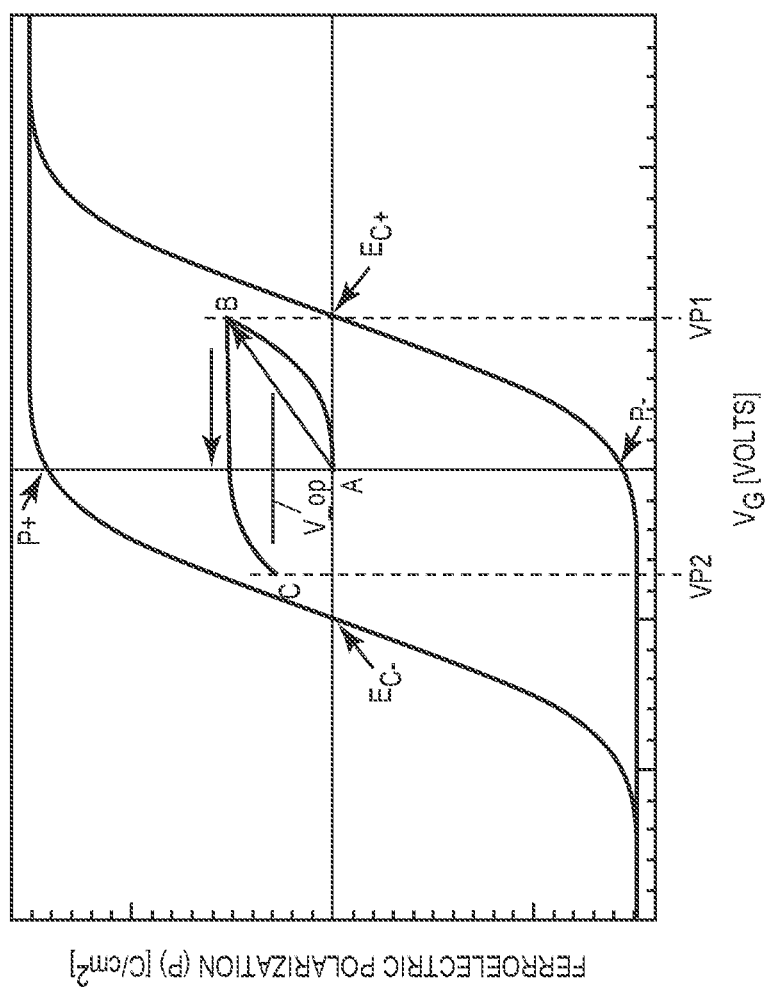
FIG. 7 illustrates a characteristic hysteresis loop of induced ferroelectric polarization as a function of the applied gate voltage for the ferroelectric insulator of the gate dielectric stack, including for a programming/setting process that sets the ferroelectric insulator into a defined polarization state.

FIG. 7 illustrates a characteristic hysteresis loop of induced polarization 'P' as a function of applied gate voltage $V_G$ and applied electric field 'E' for the ferroelectric insulator 116. During an overtemperature event or during start-up of the power transistor, the ferroelectric insulator 116 may have little or no ferroelectric polarization as indicated by state 'A' in FIG. 7. However, the ferroelectric insulator 116 should be in a well-defined polarization state when in use, both before and after an overtemperature event subsides or after prolonged absence of the gate voltage $V_G$, to ensure a low and predictable threshold voltage for actuating the power transistor. This means that the ferroelectric part of the polarization of the ferroelectric should be set to a suitable and reproducible value. By placing the ferroelectric insulator 116 into a defined polarization state after an overtemperature event subsides or during start-up of the power transistor, the threshold voltage is restored to the same voltage ($V_{GE,th1}$) as before the overtemperature event or during the normal operating mode.

The ferroelectric insulator 116 may be placed into a defined polarization state by applying a voltage pulse to the control terminal of the power transistor that exceeds the maximum (permitted) voltage of the switching control signal used to control the switching state (on/off) of the power transistor in the normal operating mode. As the voltage pulse is applied, the ferroelectric domains align within the ferroelectric insulator 116 and the voltage drop across the ferroelectric insulator 116 enables the ferroelectric insulator 116 to attain a stable polarization state (state 'B' in FIG. 4). The ferroelectric insulator 116 may be placed into a defined state 'C' in FIG. 4 by further applying a second voltage pulse to the control terminal of the power transistor, the second voltage pulse having the opposite polarity as the first voltage pulse and exceeding the minimum voltage of the switching control signal.

In the case of the power transistor being an n-channel device, the maximum voltage of the switching control signal is a positive maximum voltage, the first voltage pulse is more positive than the positive maximum voltage of the switching control signal, the minimum voltage of the switching control signal is a negative minimum voltage, and the second voltage pulse is more negative than the negative minimum voltage of the switching control signal. In the case of the power transistor being a p-channel device, the maximum voltage of the switching control signal is a negative maximum voltage, the first voltage pulse is more negative than the negative maximum voltage of the switching control signal, the minimum voltage of the switching control signal is a positive minimum voltage, and the second voltage pulse is more positive than the positive minimum voltage of the switching control signal. So long as the ferroelectric polarization is maintained in the ferroelectric insulator 116, the device continues to be turned on at a specific gate voltage $V_G$. Otherwise, the ferroelectric insulator 116 is placed into a defined polarization state before resuming the normal operating mode.

For the example illustrated in FIG. 7, the ferroelectric insulator 116 has a thickness of 100 nm and Ec=1 MV/cm where $E_c$ is the coercive field of the ferroelectric insulator 116. Only the ferroelectric part of the polarization is shown in FIG. 7, which is the part of the polarization that can be permanently changed by sufficiently high fields. The total polarization includes a dielectric part as well. This additional part has a constant slope, proportional to the dielectric constant, and is zero at zero electric field. In the example of FIG. 7, the switching control signal for the power transistor device has a gate voltage (VG) range of −5V and +5V as indicated by the line labelled V_op. The first voltage pulse VP1 applied to the control terminal of the power transistor device as part of the ferroelectric programming/setting process is set to +10V which corresponds to an electric field of 1*|Ec|, in this example. The second voltage pulse VP2 applied to the control terminal of the power transistor device as part of the ferroelectric programming/setting process is set to −7V. The simulation results are almost the same for a stack of the same total thickness including one-half ferroelectric and one-half dielectric both with the same dielectric constant. However, the influence on the properties of the channel 118 is also halved.

Figure 8:
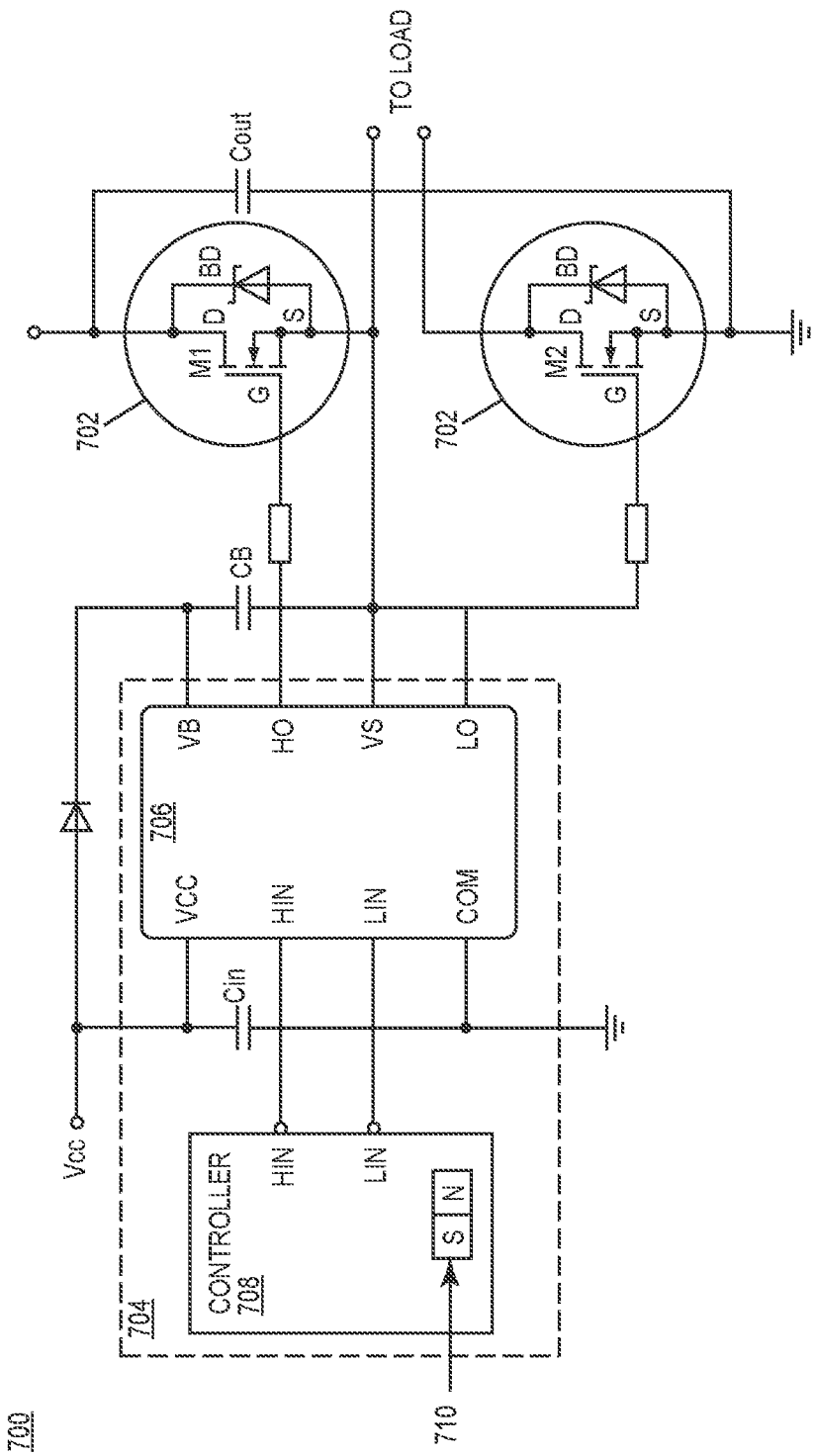
FIG. 8 illustrates a schematic diagram of an embodiment of a driver device configured to control switching of one or more power semiconductor devices, and to implement the ferroelectric programming/setting process.

FIG. 8 illustrates an embodiment of a driver device 700 configured to control the switching of one or more power semiconductor devices 702, and to implement the ferroelectric programming/setting process described herein. Each power semiconductor device 702 controlled by the driver device 700 may be any one of the kind of devices described herein. Accordingly, each power semiconductor device 702 has a plurality of transistor cells electrically connected in parallel to form a power transistor Mx, wherein each transistor cell comprises a gate structure 110 including a gate electrode 112 coupled to a control terminal such as a gate (G) terminal of the power transistor Mx and a gate dielectric stack 114, the gate dielectric stack 114 including a ferroelectric insulator 116. A diode BD may be integrated with each power transistor Mx or provided as a separate component. In FIG. 8, a pair of power transistors M1, M2 is coupled in a half bridge configuration. This is just an example. Any type of power transistor configuration may be controlled by the driver device 700, e.g., such as a single power transistor in the case of a buck converter, boost converter, etc., six power transistors in the case of a three-phase power converter, etc.

Regardless of the type of power transistor configuration, the driver device 700 includes a driver control circuit 704 for switching each power transistor Mx in the normal operating mode by applying a switching control signal HO, LO to the control terminal G of the corresponding power transistor Mx. For example, in the case of a half bridge configuration as shown in FIG. 8, the driver control circuit 704 provides a first switching control signal HO to the control terminal G of the high-side power transistor M1 of the half bridge and a second switching control signal LO to the control terminal G of the low-side power transistor M2 of the half bridge. In general, the driver control circuit 704 includes a gate driver 706 configured to generate switching control signal(s) of sufficient voltage and current to drive the gate of the corresponding power transistor Mx. For example, the gate driver may include a pre-driver coupled to the control terminal G of each power transistor Mx and level-shift circuitry in the case of a half bridge configuration with a high-side power transistor M1. The gate driver 706 is supplied by Vcc and may provide a bootstrap voltage via a capacitor CB connected between terminals VB and VS. An input capacitor Cin may be provided between the voltage supply VCC and a common terminal COM of the gate driver 706.

The gate driver 706 receives a corresponding control signal HIN, LIN from a controller 708 such as a microcontroller. For example, each control signal HIN, LIN generated by the controller 708 may be a PWM (pulse width modulation) signal. The gate driver 706 generates each switching control signal HO, LO based on the logic level of the corresponding control signal HIN, LIN received from the controller 708.

Each power transistor switching control signal HO, LO has a maximum voltage and a minimum voltage. For example, in the case of an n-channel power transistor Mx, the maximum voltage is a positive voltage such as +5V and the minimum voltage is 0V or a negative voltage such as −5V. In the case of a p-channel power transistor Mx, the maximum voltage is a negative voltage such as −5V and the minimum voltage is 0V or a positive voltage such as +5V.

Each power transistor Mx has a ferroelectric insulator 116 in the gate dielectric stack 114 of the gate structure 110 of each transistor cell. As previously explained herein, the ferroelectric insulator 116 may lose its polarization state during an overtemperature event or after a prolonged absence (0V) of the corresponding switching control signal HO, LO. The driver control circuit 704 is configured to set the ferroelectric insulator 116 of each power transistor Mx into a defined polarization state after an overtemperature event subsides or during start-up (i.e., before the power semiconductor device 702 enters the normal operating mode), by applying a first voltage pulse to the control terminal G of the corresponding power transistor Mx, the first voltage pulse exceeding the maximum voltage of the switching control signal Ho, Lo for that power transistor Mx.

The controller 708 may include a register 710 for storing configuration information for both the normal operating mode control 'N' and the ferroelectric programming/setting mode '5'. The controller 708 may set the corresponding control signals HIN, LIN correspondingly depending on whether the driver device 700 determines the corresponding power transistor Mx should be in the normal operating mode control 'N' or in the ferroelectric programming/setting mode.

Figure 9:
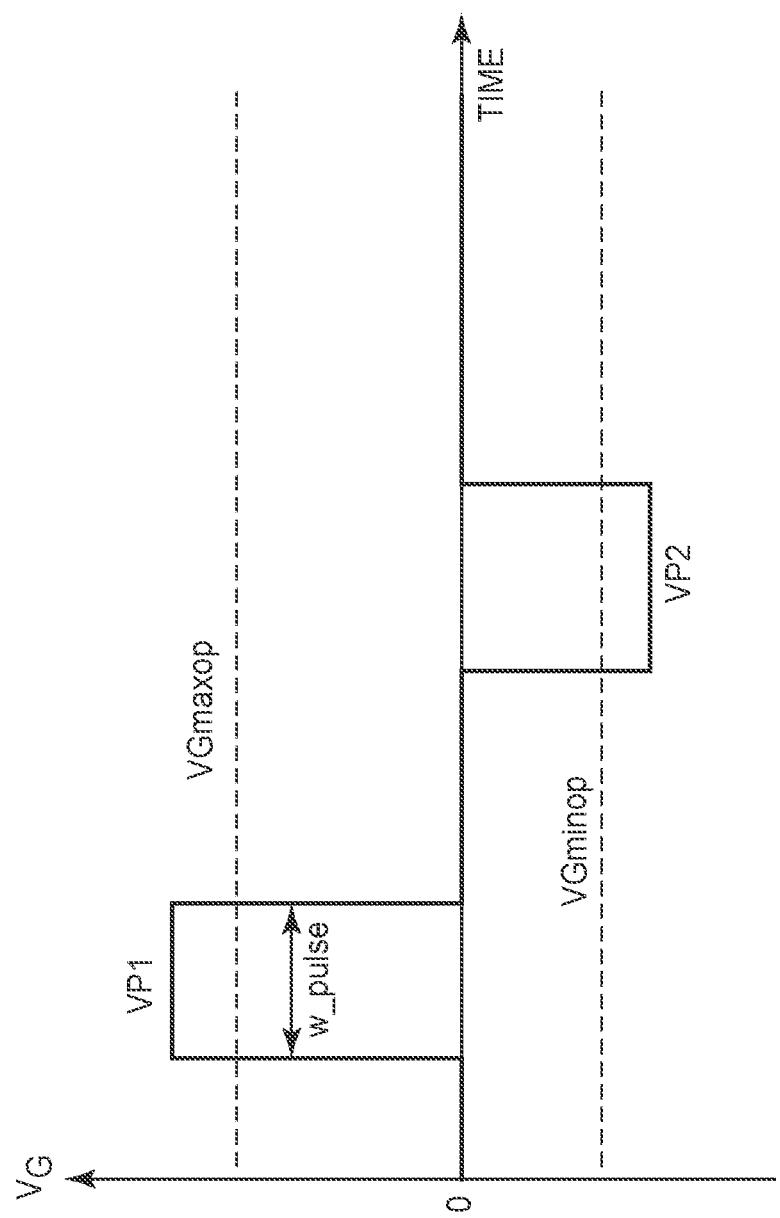
FIGS. 9 through 11 illustrate embodiments of the ferroelectric programming/setting process.
Figure 10:
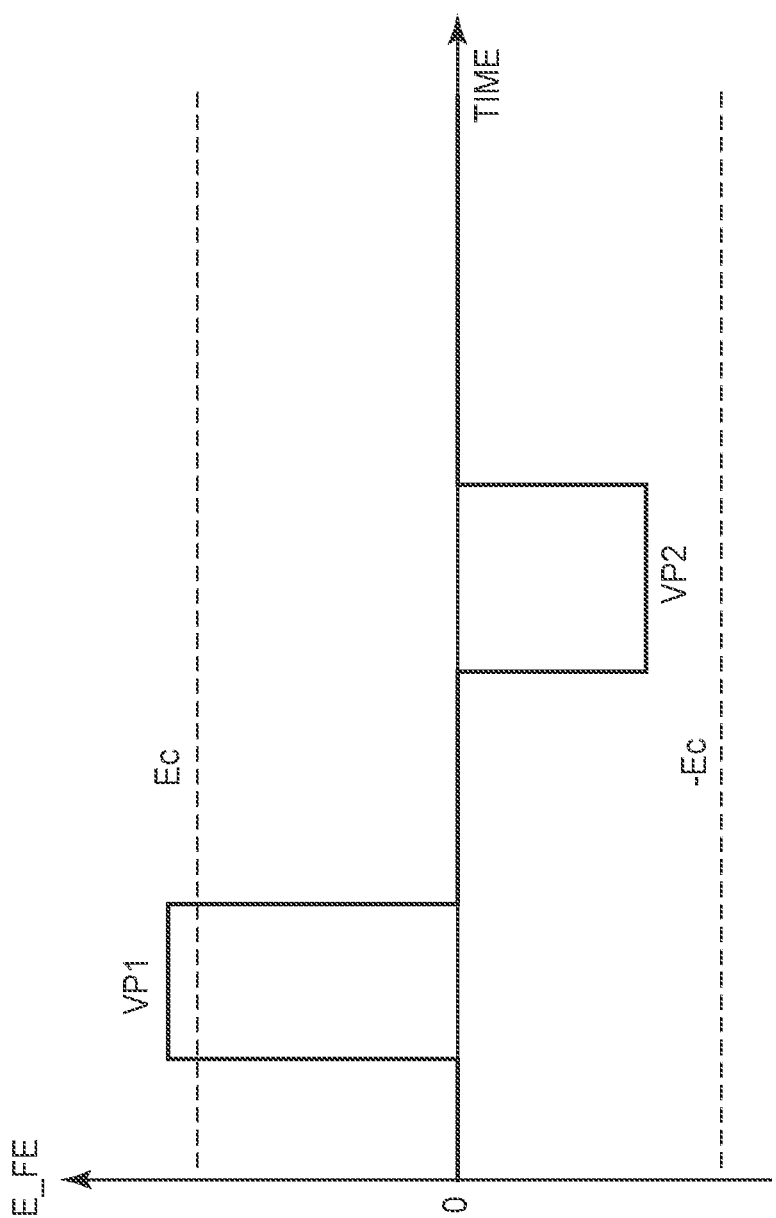
Figure 11:
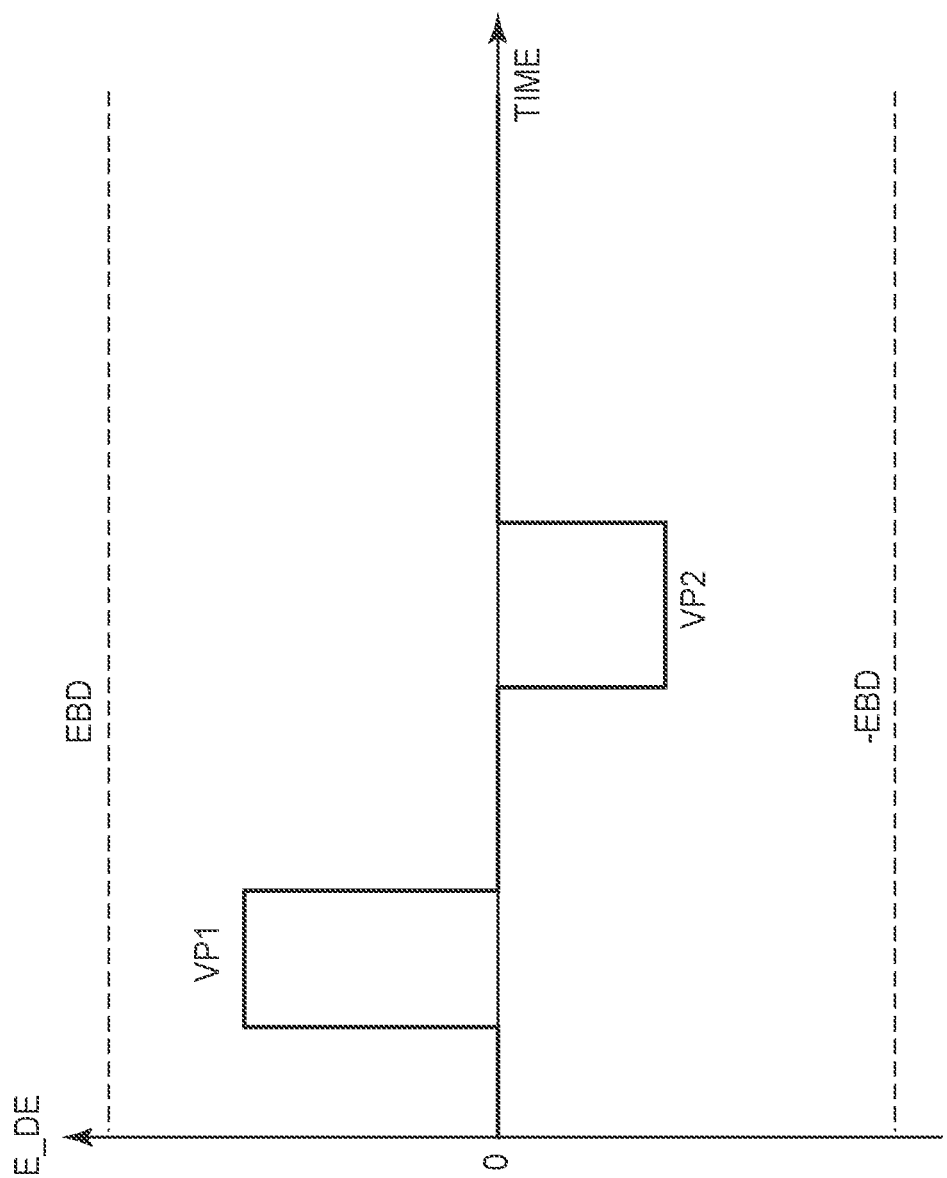

Described next with reference to FIGS. 9 through 11 are embodiments of the ferroelectric programming/setting mode carried out by the driver device 700. These embodiments are described in the context of an n-channel power transistor where the maximum voltage of the corresponding switching control signal Ho, Lo is a positive voltage 'VGmaxop' such as +5V and the minimum voltage of the corresponding switching control signal Ho, Lo is a negative voltage 'VGminop' such as −5V. For a p-channel power transistor, the polarities are reversed such that the maximum voltage is a negative voltage such as −5V and the minimum voltage is a positive voltage such as +5V since p-channel devices are off for positive gate voltages. Accordingly, in the following embodiments, 'exceeding' means to go beyond or surpass in terms of absolute magnitude, i.e., to be more positive in the case of a positive voltage or to be more negative in the case of a negative voltage.

FIG. 9 illustrates an embodiment of the ferroelectric programming/setting mode carried out by the driver device 700. According to this embodiment, the driver device 700 sets the ferroelectric insulator 116 of each power transistor Mx into a defined polarization state by applying a first voltage pulse 'VP1' to the control terminal G of each transistor Mx that exceeds the maximum voltage VGmaxop of the corresponding switching control signal HO, LO. For example, the first voltage pulse VP1 may exceed the maximum voltage VGmaxop of the corresponding switching control signal HO, LO by at least 20%. The first voltage pulse VP1 places the ferroelectric insulator 116 into defined polarization state A in FIG. 7, for example. In one embodiment, the duration 'wpulse' of the first voltage pulse is in a range of 100 ns to 100 ms.

As part of the ferroelectric programming/setting mode, the driver device 700 may also apply a second voltage pulse 'VP2' to the control terminal G of each power transistor Mx. The second voltage pulse VP2 has the opposite polarity as the first voltage pulse VP1 and exceeds the minimum voltage VGminop of the corresponding switching control signal HO, LO. For example, the second voltage pulse VP2 may exceed the minimum voltage VGminop of the corresponding switching control signal HO, LO by at least 20%. In one embodiment, the first voltage pulse VP1 exceeds the maximum voltage VGmaxop of the corresponding switching control signal HO, LO by a first percentage, the second voltage pulse VP2 exceeds the minimum voltage VGminop of the switching control signal HO, LO by a second percentage, and the first percentage is greater than the second percentage. That is, |VP1|>VGmaxop by a greater percentage than |VP2|>VGminop.

The second voltage pulse VP2 places the ferroelectric insulator 116 into defined polarization state C in FIG. 7, for example. In one embodiment, the magnitude |VP1| of the first voltage pulse VP1 is set such that the electric field in the ferroelectric insulator 116 during the first voltage pulse VP1 exceeds |$E_c$| and the magnitude |VP2| of the second voltage pulse VP2 is set such that the electric field in the ferroelectric insulator 116 during the second voltage pulse VP1 is below |$E_c$|, e.g., as shown in FIG. 10.

The voltage pulses VP1, VP2 may be applied after an overtemperature event subsides, during start-up of the power transistor(s) Mx, or even during the normal operating mode. In the normal operating mode, the driver control circuit 704 may set the ferroelectric insulator 116 into a defined polarization state by applying the first voltage pulse VP1 to the control terminal G during an on period of the corresponding switching control signal HO, LO. For example, the first voltage pulse VP1 may be superimposed onto the corresponding switching control signal HO, LO during an on period of the switching control signal HO, LO. The second voltage pulse VP2 may be applied to the control terminal G during an off period of the corresponding switching control signal HO, LO. The order of the pulses VP1, VP2 may be reversed in that the second voltage pulse VP2 may be applied to the control terminal G of each power transistor Mx before the first voltage pulse VP1.

The gate driver 706 of the driver device 700 may include a standard driver for driving the control terminal G of each power transistor Mx in normal operating mode, and an overdrive driver for generating the elevated gate voltages VP1, VP2 in the ferroelectric programming/setting mode. Alternatively, the gate driver 706 may include a single driver that can provide more than 2 different gate voltage levels to each power transistor Mx, to generate the maximum and minimum voltages VGmaxop, VGminop of the switching control signals Ho, Lo and to generate the ferroelectric programming/setting voltages VP1, VP2.

FIG. 10 illustrates another embodiment of the ferroelectric programming/setting mode carried out by the driver device 700. The embodiment illustrated in FIG. 10 may be used in conjunction with the embodiment illustrated in FIG. 9.

According to the embodiment illustrated in FIG. 10, the driver device 700 sets the ferroelectric insulator 116 of each power transistor Mx into a defined polarization state by setting the magnitude |VP1| of the first voltage pulse VP1 such that the electric field 'E_FE' in the ferroelectric insulator 116 during the first voltage pulse VP1 is at least 0.7*|$E_c$| where $E_c$ is the coercive field of the ferroelectric insulator 116. The magnitude |VP1| of the first voltage pulse VP1 may be set even higher, e.g., such that the electric field in the ferroelectric insulator 116 during the first voltage pulse VP1 is at least 0.8*|$E_c$|, is at least 0.9*|$E_c$|, equal to |$E_c$| or even greater than |$E_c$|, e.g., 1.5*|Ec|.

If a (non-ferroelectric) dielectric insulator is included in the gate dielectric stack 114, e.g., as shown in FIGS. 2 through 6, the magnitude |VP1| of the first voltage pulse VP1 is set such that the electric field in such a dielectric insulator is less than its breakdown field, e.g., no more than 70% of its breakdown field. In the case of HfO$_2$ as the ferroelectric insulator 116, the coercive field of HfO$_2$ is about 1 MV/cm. A dielectric material with a higher permittivity than SiO$_2$ is preferred for each (non-ferroelectric) dielectric insulator since an electric field of about 6 MV/cm would arise in SiO$_2$ for a 1 MV/cm in the ferroelectric insulator 116, which is near the breakdown electric field of SiO$_2$. Accordingly, each (non-ferroelectric) dielectric insulator included in the gate dielectric stack 114 may comprise a material selected from the group consisting of undoped hafnium oxide, undoped hafnium zirconium oxide, yttrium oxide, and aluminum oxide, such that the relative permittivity of each (non-ferroelectric) dielectric insulator included in the gate dielectric stack 114 is at least half, or a third or a quarter of the relative permittivity of the ferroelectric insulator 116. The ratio of the electric fields is accordingly lower if such a (non-ferroelectric) dielectric insulator is used in the gate dielectric stack 114, and a higher polarization may be obtained. This includes particularly the case where the dielectric material has a similar dielectric constant as the ferroelectric material such that during the setting/programming pulse, an electric field even higher than the coercive field can be reached.

If the second voltage pulse VP2 is used as part of the ferroelectric programming/setting mode carried out by the driver device 700, the magnitude |VP2| of the second voltage pulse VP2 may be set such that the electric field in the ferroelectric insulator 116 during the second voltage pulse VP2 is at most 0.8*|$E_c$|.

FIG. 11 illustrates another embodiment of the ferroelectric programming/setting mode carried out by the driver device 700. The embodiment illustrated in FIG. 11 may be used in conjunction with the embodiment illustrated in FIG. 9 and/or the embodiment illustrated in FIG. 10.

According to the embodiment illustrated in FIG. 11, the gate dielectric stack 114 includes at least one (non-ferroelectric) dielectric insulator, e.g., as shown in FIGS. 2 through 6, and the magnitude |VP1| of the first voltage pulse VP1 is set such that the electric field 'E_DE' in each (non-ferroelectric) dielectric insulator during the first voltage pulse VP1 is less than |$E_{BD}$| where $E_{BD}$ is the maximum electric field that each (non-ferroelectric) dielectric insulator can withstand without undergoing electrical breakdown. In one embodiment, the magnitude |VP1| of the first voltage pulse VP1 is set such that the electric field in each (non-ferroelectric) dielectric insulator during the first voltage pulse VP1 is at most 0.7*|EBD| and/or the magnitude |VP2| of the second voltage pulse VP2 is set such that the electric field in each (non-ferroelectric) dielectric insulator during the second voltage pulse VP2 is at most 0.7*|$E_{BD}$|

Although the present disclosure is not so limited, the following numbered examples demonstrate one or more aspects of the disclosure.

Example 1. A power semiconductor device, comprising: a semiconductor substrate; and a plurality of transistor cells formed in the semiconductor substrate and electrically connected in parallel to form a power transistor, wherein each transistor cell of the plurality of transistor cells comprises a gate structure including a gate electrode and a gate dielectric stack separating the gate electrode from the semiconductor substrate, wherein the gate dielectric stack comprises a ferroelectric insulator and a first dielectric insulator, wherein the first dielectric insulator has a relative permittivity greater than that of silicon dioxide.

Example 2. The power semiconductor device of example 1, wherein the ferroelectric insulator comprises a material selected from the group consisting of doped hafnium oxide and doped hafnium zirconium oxide.

Example 3. The power semiconductor device of example 2, wherein a doping material of the doped hafnium oxide or doped hafnium zirconium oxide comprises one or more impurity species selected from the group consisting of Al, Si, Gd, Yr, La, Sr, and Zr.

Example 4. The power semiconductor device of any of examples 1 through 3, wherein the first dielectric insulator comprises a material selected from the group consisting of undoped hafnium oxide, undoped hafnium zirconium oxide, yttrium oxide, and aluminum oxide.

Example 5. The power semiconductor device of any of examples 1 through 4, wherein the ferroelectric insulator contacts the semiconductor substrate and separates the first dielectric insulator from the semiconductor substrate.

Example 6. The power semiconductor device of any of examples 1 through 4, wherein the gate dielectric stack further comprises a second dielectric insulator, wherein the second dielectric insulator contacts the semiconductor substrate and separates the ferroelectric insulator from the semiconductor substrate, and wherein the ferroelectric insulator separates the second dielectric insulator from the first dielectric insulator.

Example 7. The power semiconductor device of example 6, wherein the ferroelectric insulator comprises a material selected from the group consisting of doped hafnium oxide and doped hafnium zirconium oxide, wherein the first dielectric insulator comprises a material selected from the group consisting of undoped hafnium oxide, undoped hafnium zirconium oxide, yttrium oxide, and aluminum oxide, and wherein the second dielectric insulator comprises a material selected from the group consisting of undoped hafnium oxide, undoped hafnium zirconium oxide, yttrium oxide, and aluminum oxide.

Example 8. The power semiconductor device of any of examples 1 through 7, wherein the gate structure of each transistor cell of the plurality of transistor cells is a trench gate structure disposed in a trench formed in the semiconductor substrate.

Example 9. The power semiconductor device of any of examples 1 through 9, wherein the power transistor has a specified operating temperature range, and wherein the ferroelectric insulator has a Curie temperature in a range above the specified operating temperature range of the power transistor.

Example 10. A method of operating a power transistor formed by a plurality of transistor cells electrically connected in parallel, wherein each transistor cell of the plurality of transistor cells comprises a gate structure including a gate electrode coupled to a control terminal and a gate dielectric stack, wherein the gate dielectric stack comprises a ferroelectric insulator, the method comprising: switching the power transistor in a normal operating mode by applying a switching control signal to the control terminal, the switching control signal having a maximum voltage and a minimum voltage; and setting the ferroelectric insulator into a defined polarization state by applying a first voltage pulse to the control terminal, the first voltage pulse exceeding the maximum voltage of the switching control signal.

Example 11. The method of example 10, wherein applying the first voltage pulse to the control terminal comprises setting a magnitude of the first voltage pulse such that an electric field in the ferroelectric insulator during the first voltage pulse is at least $0.7*|E_c|$ where $E_c$ is the coercive field of the ferroelectric insulator.

Example 12. The method of example 10 or 11, wherein the first voltage pulse exceeds the maximum voltage of the switching control signal by at least 20%.

Example 13. The method of any of examples 10 through 12, wherein the gate dielectric stack further comprises at least one dielectric insulator, and wherein applying the first voltage pulse to the control terminal comprises setting a magnitude of the first voltage pulse such that an electric field in the at least one dielectric insulator during the first voltage pulse is less than $|E_{BD}|$ where $E_{BD}$ is the maximum electric field that the at least one dielectric insulator can withstand without undergoing electrical breakdown.

Example 14. The method of example 13, wherein the magnitude of the first voltage pulse is set such that the electric field in the at least one dielectric insulator during the first voltage pulse is at most $0.7*|E_{BD}|$.

Example 15. The method of any of examples 10 through 14, wherein a duration of the first voltage pulse is in a range of 100 ns to 100 ms.

Example 16. The method of any of examples 10 through 15, wherein setting the ferroelectric insulator into the defined polarization state further comprises: applying a second voltage pulse to the control terminal, wherein the second voltage pulse has an opposite polarity as the first voltage pulse, wherein the second voltage pulse exceeds the minimum voltage of the switching control signal.

Example 17. The method of example 16, wherein: the power transistor is an n-channel device, the maximum voltage of the switching control signal is a positive maximum voltage, the first voltage pulse is more positive than the positive maximum voltage of the switching control signal, the minimum voltage of the switching control signal is a negative minimum voltage, and the second voltage pulse is more negative than the negative minimum voltage of the switching control signal; or the power transistor is a p-channel device, the maximum voltage of the switching control signal is a negative maximum voltage, the first voltage pulse is more negative than the negative maximum voltage of the switching control signal, the minimum voltage of the switching control signal is a positive minimum voltage, and the second voltage pulse is more positive than the positive minimum voltage of the switching control signal.

Example 18. The method of example 16 or 17, wherein applying the second voltage pulse to the control terminal comprises setting a magnitude of the second voltage pulse such that an electric field in the ferroelectric insulator during the second voltage pulse is at most $0.8*|E_c|$ where $E_c$ is the coercive field of the ferroelectric insulator.

Example 19. The method of example 16 or 17, wherein: applying the first voltage pulse to the control terminal comprises setting a magnitude of the first voltage pulse such that an electric field in the ferroelectric insulator during the first voltage pulse exceeds $|E_c|$ where $E_c$ is the coercive field of the ferroelectric insulator; and applying the second voltage pulse to the control terminal comprises setting a magnitude of the second voltage pulse such that an electric field in the ferroelectric insulator during the second voltage pulse is below $|E_c|$.

Example 20. The method of any of examples 16 through 19, wherein the second voltage pulse exceeds the minimum voltage of the switching control signal by at least 20%.

Example 21. The method of any of examples 16 through 20, wherein: the gate dielectric stack further comprises at least one dielectric insulator; applying the first voltage pulse to the control terminal comprises setting a magnitude of the first voltage pulse such that an electric field in the at least one dielectric insulator during the first voltage pulse is less than $|E_{BD}|$ where $E_{BD}$ is the maximum electric field that the at least one dielectric insulator can withstand without undergoing electrical breakdown; applying the second voltage pulse to the control terminal comprises setting a magnitude of the second voltage pulse such that an electric field in the at least one dielectric insulator during the second voltage pulse is less than $|E_{BD}|$; and the magnitude of the electric field in the at least one dielectric insulator during the second voltage pulse is less than the magnitude of the electric field in the at least one dielectric insulator during the first voltage pulse.

Example 22. The method of any of examples 16 through 21, wherein the first voltage pulse exceeds the maximum voltage of the switching control signal by a first percentage, wherein the second voltage pulse exceeds the minimum voltage of the switching control signal by a second percentage, and wherein the first percentage is greater than the second percentage.

Example 23. The method of any of examples 10 through 22, wherein the ferroelectric insulator is set into the defined polarization state during start-up of the power semiconductor device, before the power semiconductor device enters the normal operating mode.

Example 24. The method of any of examples 10 through 23, wherein the power transistor has a specified operating temperature range, wherein the ferroelectric insulator has a Curie temperature in a range above the specified operating temperature range of the power transistor, wherein an operating temperature of the power transistor exceeds the specified operating temperature range during an overtemperature event, and wherein the ferroelectric insulator is set into the defined polarization state after the overtemperature event subsides.

Example 25. The method of any of examples 10 through 24, wherein the ferroelectric insulator is set into the defined polarization state during the normal operating mode by applying the first voltage pulse the control terminal during an on period of the switching control signal.

Example 26. A driver device, comprising: a power semiconductor device comprising a plurality of transistor cells electrically connected in parallel to form a power transistor, wherein each transistor cell of the plurality of transistor cells comprises a gate structure including a gate electrode coupled to a control terminal and a gate dielectric stack, wherein the gate dielectric stack comprises a ferroelectric insulator; and a driver control circuit configured to switch the power transistor in a normal operating mode by applying a switching control signal to the control terminal, the switching control signal having a maximum voltage and a minimum voltage, wherein the driver control circuit is further configured to set the ferroelectric insulator into a defined polarization state by applying a first voltage pulse to the control terminal, the first voltage pulse exceeding the maximum voltage of the switching control signal.

Example 27. The driver device of example 26, wherein the driver control circuit is configured to set the ferroelectric insulator into the defined polarization state during start-up of the power semiconductor device, before the power semiconductor device enters the normal operating mode.

Example 28. The driver device of example 26 or 27, wherein the power transistor has a specified operating temperature range, wherein the ferroelectric insulator has a Curie temperature in a range above the specified operating temperature range of the power transistor, wherein an operating temperature of the power transistor exceeds the specified operating temperature range during an overtemperature event, and wherein the driver control circuit is configured to set the ferroelectric insulator into the defined polarization state after the overtemperature event subsides.

Example 29. The driver device of any of examples 26 through 28, wherein the driver control circuit is configured to set the ferroelectric insulator into the defined polarization state during the normal operating mode by applying the first voltage pulse to the control terminal during an on period of the switching control signal.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A driver device, comprising:
    a power semiconductor device comprising a plurality of transistor cells electrically connected in parallel to form a power transistor, wherein each transistor cell of the plurality of transistor cells comprises a gate structure including a gate electrode coupled to a control terminal and a gate dielectric stack, wherein the gate dielectric stack comprises a ferroelectric insulator; and
    a driver control circuit configured to switch the power transistor in a normal operating mode by applying a switching control signal to the control terminal, the switching control signal having a maximum voltage and a minimum voltage,
    wherein the driver control circuit is further configured to set the ferroelectric insulator into a defined polarization state by applying a first voltage pulse to the control terminal, the first voltage pulse exceeding the maximum voltage of the switching control signal.

2. The driver device of claim 1, wherein the driver control circuit is configured to set the ferroelectric insulator into the defined polarization state during start-up of the power semiconductor device, before the power semiconductor device enters the normal operating mode.

3. The driver device of claim 1, wherein the power transistor has a specified operating temperature range, wherein the ferroelectric insulator has a Curie temperature in a range above the specified operating temperature range of the power transistor, wherein an operating temperature of the power transistor exceeds the specified operating temperature range during an overtemperature event, and wherein the driver control circuit is configured to set the ferroelectric insulator into the defined polarization state after the overtemperature event subsides.

4. The driver device of claim 1, wherein the driver control circuit is configured to set the ferroelectric insulator into the defined polarization state during the normal operating mode by applying the first voltage pulse to the control terminal during an on period of the switching control signal.

5. The driver device of claim 1, wherein the gate dielectric stack further comprises a first dielectric insulator, and wherein the first dielectric insulator has a relative permittivity greater than that of silicon dioxide.

6. The driver device of claim 5, wherein the ferroelectric insulator comprises a material selected from the group consisting of doped hafnium oxide and doped hafnium zirconium oxide.

7. The driver device of claim 6, wherein a doping material of the doped hafnium oxide or doped hafnium zirconium oxide comprises one or more impurity species selected from the group consisting of Al, Si, Gd, Yr, La, Sr, and Zr.

8. The driver device of claim 5, wherein the first dielectric insulator comprises a material selected from the group consisting of undoped hafnium oxide, undoped hafnium zirconium oxide, yttrium oxide, and aluminum oxide.

9. The driver device of claim 5, wherein the ferroelectric insulator contacts the semiconductor substrate and separates the first dielectric insulator from the semiconductor substrate.

10. The driver device of claim 5, wherein the gate dielectric stack further comprises a second dielectric insulator, wherein the second dielectric insulator contacts the semiconductor substrate and separates the ferroelectric insulator from the semiconductor substrate, and wherein the ferroelectric insulator separates the second dielectric insulator from the first dielectric insulator.

11. The driver device of claim 10, wherein the ferroelectric insulator comprises a material selected from the group consisting of doped hafnium oxide and doped hafnium zirconium oxide, wherein the first dielectric insulator comprises a material selected from the group consisting of undoped hafnium oxide, undoped hafnium zirconium oxide, yttrium oxide, and aluminum oxide, and wherein the second dielectric insulator comprises a material selected from the group consisting of undoped hafnium oxide, undoped hafnium zirconium oxide, yttrium oxide, and aluminum oxide.

12. The driver device of claim 5, wherein the gate structure of each transistor cell of the plurality of transistor cells is a trench gate structure disposed in a trench formed in the semiconductor substrate.

\* \* \* \* \*